(12) United States Patent
Chiyoda

(10) Patent No.: US 6,316,951 B1
(45) Date of Patent: Nov. 13, 2001

(54) INSPECTION UNIT OF A CONNECTOR INSPECTION APPARATUS

(75) Inventor: Kenji Chiyoda, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 09/119,656

(22) Filed: Jul. 21, 1998

(30) Foreign Application Priority Data

Jul. 31, 1997 (JP) .................................................... 9-206815

(51) Int. Cl.[7] .............................. G01R 1/01; G01R 31/04
(52) U.S. Cl. ........................................... 324/754; 324/72.5
(58) Field of Search ..................................... 324/538, 537, 324/754; 439/310, 487, 488

(56) References Cited

U.S. PATENT DOCUMENTS

| 5,410,115 | 4/1995 | Hizume et al. | 200/61.76 |
|---|---|---|---|
| 5,467,023 | * 11/1995 | Takeyama | 324/754 |
| 5,627,473 | * 5/1997 | Takani | 324/538 |
| 5,629,627 | * 5/1997 | Hoshino et al. | 324/538 |
| 5,730,626 | * 3/1998 | Tomita et al. | 439/595 |
| 5,744,966 | 4/1998 | Sato | 324/538 |

FOREIGN PATENT DOCUMENTS

| 356222 | 2/1990 | (EP) . | |
|---|---|---|---|
| 649028 | 4/1995 | (EP) . | |
| 0123456 | * 1/2000 | (EP) | 100/100 |
| 9-105764 | 4/1997 | (JP) . | |
| 161875 | * 6/1997 | (JP) . | |

OTHER PUBLICATIONS

Patent Abstracs of Japan, vol. 1997, no. 8, published August 29, 1997.

* cited by examiner

Primary Examiner—Safet Metjahic
Assistant Examiner—Vincent Q. Nguyen
(74) Attorney, Agent, or Firm—Greenblum & Bernstein, P.L.C.

(57) ABSTRACT

An inspection unit is provided for carrying out the inspection of a connector of the front holder type. The inspection for failures in mounting a front holder can be achieved, thus avoiding inconveniences caused by a mounting failure of the front holder. The inspection unit includes a slider that is displaceably provided on a block body for relative displacement. A probe pin for inspecting a metal terminal and an inspection element for inspecting for the presence of the front holder are provided on the slider. Furthermore, the slider retains a front holder subject to partial mounting and includes a contact area for making contact therewith. The contact area makes contact with the front holder after engagement with the inspection element. In the event of partial mounting of the front holder, because all of the probe pins are disconnected, failure in mounting of the front holder can therefore be determined.

9 Claims, 6 Drawing Sheets

INSPECTION UNIT OF A CONNECTOR INSPECTION APPARATUS

BACKGROUND OF THE INVENTION

1. Field of the Invention

The present invention relates to an inspection unit of a connector inspection apparatus.

2. Description of Background Information

In general, a connector used for an electric wiring system such as a wire harness or the subassembly (hereinafter generally called "wire assembly") which, in general, forms a wire harness includes a plurality of cavities in a molded resin housing, with a metal terminal connected with wires being inserted within the cavities.

Among such connectors, there are known connectors of a so-called "front holder type". FIG. 5 shows a partially broken away perspective view of a known front holder type connector C which is an object of testing by the present invention, and FIG. 6 is an exploded sectional schematic view of FIG. 5.

As shown in these drawings, this type of connector C is integrally formed with a hollow housing 1, the inner periphery of the housing at the one end being open in one end opening area. The other end includes a boss member 2 projecting into an opening area 1A of the other end of housing 1. A seal ring 3 is inserted into the opening area 1A of housing 1, and a box-type front holder 4 covering one end side terminal surface of boss member 2 is introduced into the opening area 1A.

A cavity 2A is formed in boss member 2 and is connected with a plurality of terminal-fitted wires with the terminal-fitted wires being inserted which are not illustrated here. An inspection unit is generally used in inspecting the electrical wiring and connection condition, etc. of the connector C and includes a connector holder which holds connector C as an inspection object. The inspection unit has a block body on which probe pins are mounted that correspond to the metal terminals of a connector being held in the inspection unit, and the probe pins in general make contact with each metal terminal of the connector held in the inspection unit.

In this case, when the connector C to be inspected is a front holder type as mentioned above, it is necessary to conduct an inspection for continuity of each terminal, and to inspect for the presence of the front holder 4. Therefore, a conventional inspection element (a so-called "2-probe pin") having a switching finction is provided on the inspection unit in the inspection apparatus, which allows inspection to be made for the presence of the front holder 4.

SUMMARY OF THE INVENTION

The above-described inspection unit includes an inspection element which is merely mounted to project into contact with a front holder to inspect for the presence of the front holder. However, no inspection was conducted of the mounting condition of the front holder. In addition, when the inspection unit is accessed to a connector and the probe pins attempt to contact each metal terminal, if the front holder is improperly mounted, the front holder and the inspection element contact each other at a position shifted from the normal contact position, which might result in possible damage to one or the other.

The present invention was made in consideration of the above-mentioned problems, and an objective of the present invention is to provide an inspection unit of a connector inspection apparatus which will not only inspect simply the presence of the front holder, but will also inspect for failure in the mounting condition of the front holder in carrying out the inspection of connectors of a front holder type, and can avoid any problems caused by a mounting failure of the front holder.

The present invention provides a solution to the above-mentioned problem, and according to one aspect of the invention, includes an inspection unit of a connector inspection apparatus in combination with a connector. The connector includes a hollow housing, a boss member integrally formed inside the periphery of the housing and having partitioned cavities for the insertion terminals. One end of the boss member opens inside an opening on one side of the housing while the other end projects from an opening on the other side of the housing.

The connector further includes a box-type front holder which covers one side terminal area of the boss member. The inspection unit is mounted on a connector inspection apparatus for inspection of a front holder type connector on which a plurality of terminal-fitted wires is mounted by inserting a metal terminal of each terminal-fitted wire from the other side of the boss member. The inspection unit is relatively movable between an inspecting position for inspecting the connector by accessing the connector and a released position which detachably releases the connector from the connector inspection apparatus by moving away from the inspection position.

The inspection unit further includes a block body relatively displaceable between an inspection position and a released position for a connector held by the connector inspection apparatus, and a slider relatively and displaceably mounted on the block body for relative displacement in a direction toward and away from the connector. At least one probe pin is mounted on the slider for inspecting the continuity of metal terminals of the connector, and a biasing mechanism is mounted between the block body and the slider for biasing the slider toward a connector which becomes a subject of inspection.

An inspection element, having a switching finction to be connected by a biasing force weaker than the biasing mechanism, projects toward a connector side and is mounted on the slider and is engaged with the front holder of a connector during inspection.

A contact area controls the displacement of the slider so as to interrupt the connection with the metal terminals ofthe probe pin, by making contact with the front holder after connecting the inspection element during relative access of the block body and the connector to the inspection position in the case where the slider is integrally formed and the front holder is subjected to a mounting failure.

According to one aspect of the present invention, a connector is held by a connector inspection apparatus, relatively accessing a block body and the connector with an inspection element which inspects the presence of a probe pin for inspecting a metal terminal and a front holder in carrying out the checking of the connector, continuity inspection and inspection for the presence of the front holder can be achieved in the same manner as the conventional apparatus. At the same time, even if the front holder exhibits a mounting failure, an inspection element is first connected and then a contact area makes contact with the contact area. Therefore, the slider which is formed integrally with the contact area is controlled to relatively access the connector under conditions against the biasing force of a biasing mechanism, which makes a probe pin held by the slider difficult to connect with the metal terminal. As a result, the inspection element becomes connected while all of the probe pins become disconnected, which makes inspection of mounting failures of the front holder possible.

In another aspect of the present invention, an inspection unit for a connector inspection apparatus is provided that includes a block body relatively displaceable between an inspection position for a connector held by the inspection unit and a position spaced therefrom, a slider mounted on the block body for relative movement in a direction toward and away from the connector, at least one probe pin mounted on the slider for inspecting the continuity of metal terminals of the connector, and an inspection element mounted on the slider for detecting the presence of a front holder for terminals of the connector.

In another aspect of the invention, the inspection element of the inspection unit includes a spring biased switching element which projects outwardly from the slider and is biased toward the inspection position of the connector. The inspection unit may also include a biasing mechanism for biasing the slider toward the connector to be inspected, and the biasing mechanism may includes a spring corresponding with each probe pin for thereby biasing the slider toward the connector to be inspected.

According to a further aspect of the invention, the inspection element of the inspection unit may include a spring biased switching element which projects outwardly from the slider and is biased toward the inspection position of the connector, and the biasing force applied to the inspection element may be less than that applied to a respective probe pin.

According to another aspect of the invention, the inspection unit for a connector inspection apparatus can be configured so that the slider is removably mounted within the block body, and a front member may be removably mounted on the block body to provide for the removability of the slider.

BRIEF DESCRIPTION OF THE DRAWINGS

The present invention is further described in the detailed description which follows, by reference to the noted plurality of drawings by way of non-limiting examples of preferred embodiments of the present invention, in which like reference numerals represent similar parts throughout the several views of the drawings, and wherein.

DESCRIPTION OF THE PREFERRED EMBODIMENTS

The description which follows of the preferred embodiments of the present invention makes reference to the attached drawings.

Figure 1:
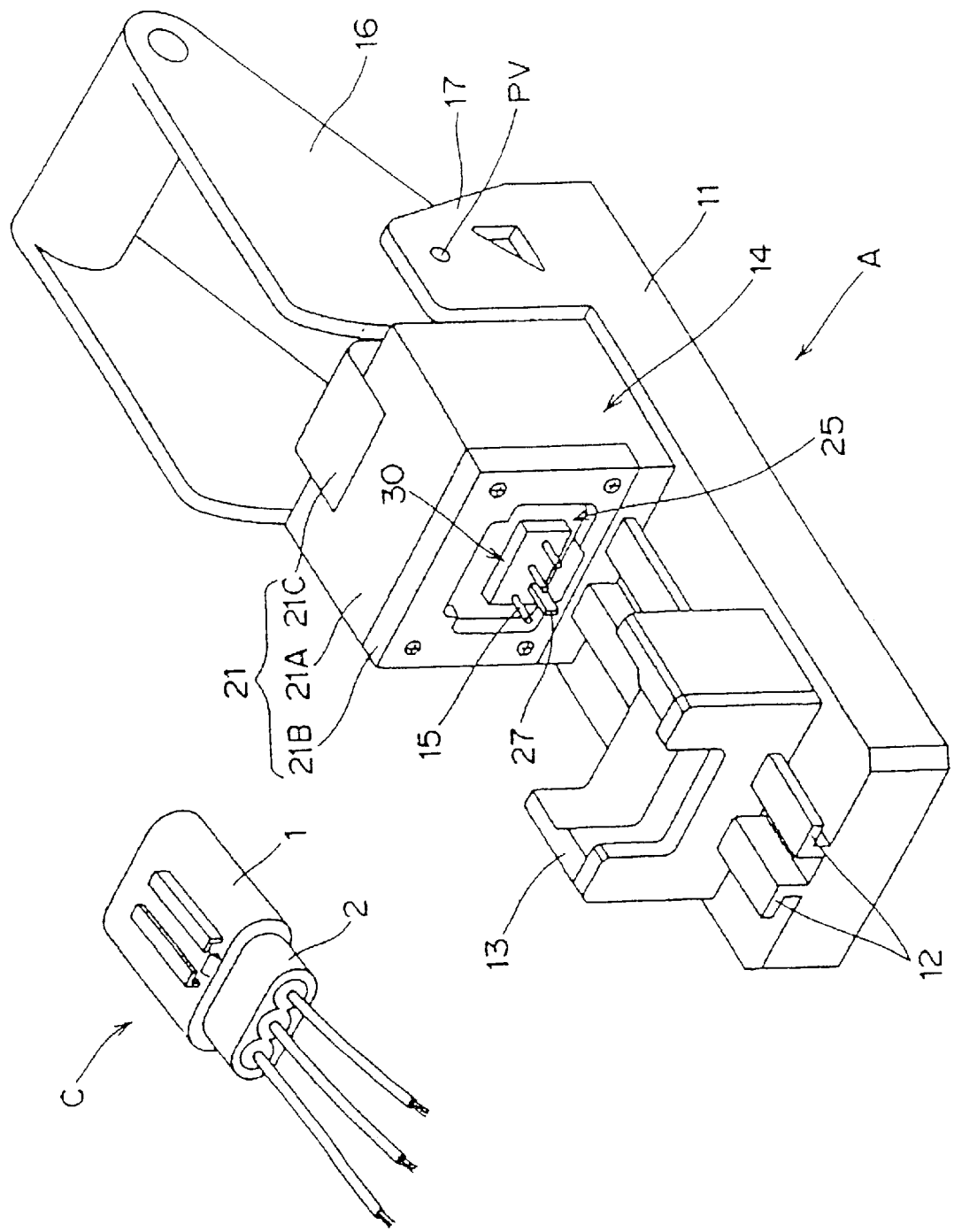
FIG. 1 illustrates a perspective view of a connector inspection apparatus which utilizes an inspection unit according to an embodiment of the present invention.
Figure 2:
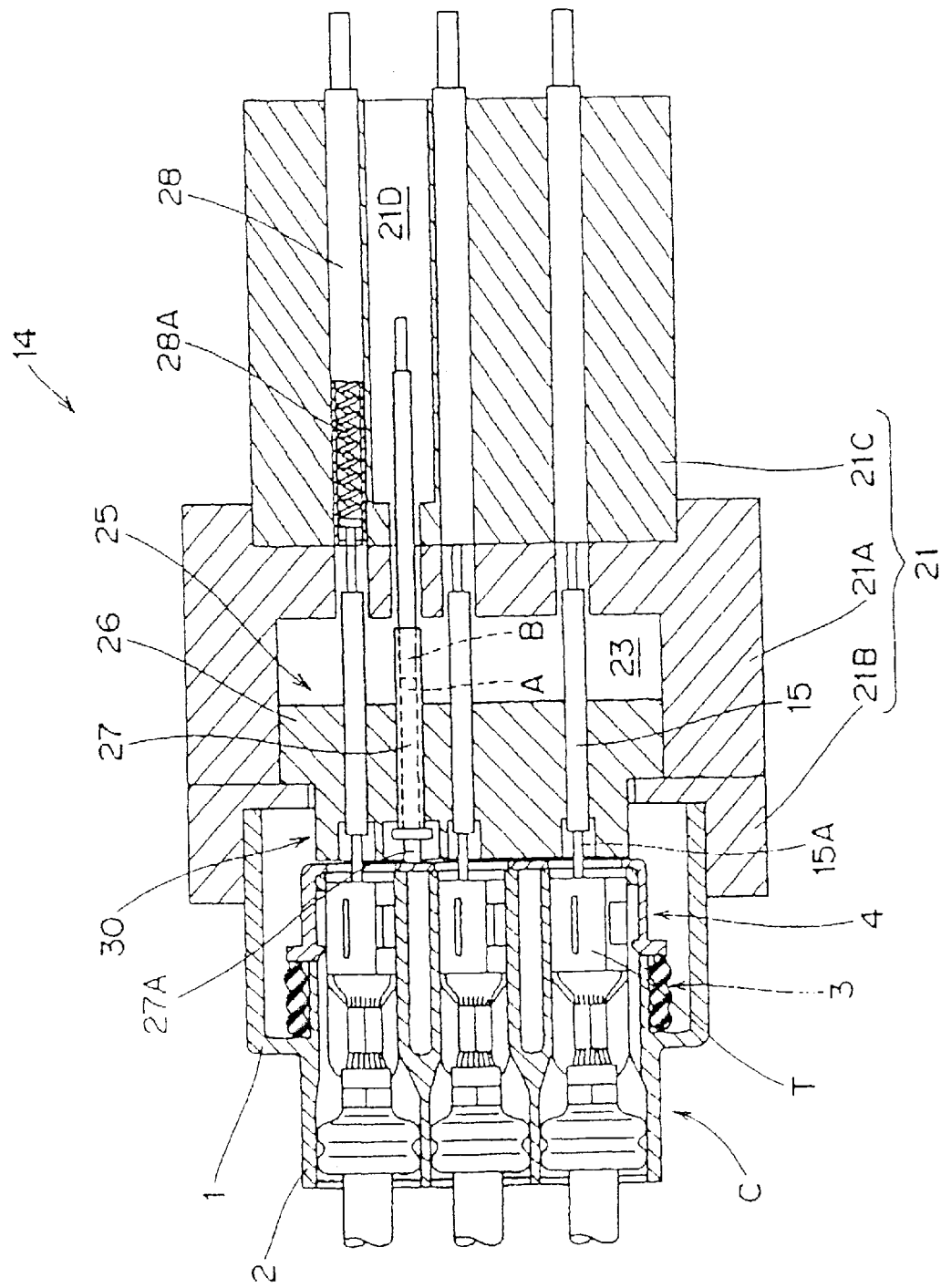
FIG. 2 illustrates a sectional view of an inspection unit in the embodiment in FIG. 1.
Figure 3:
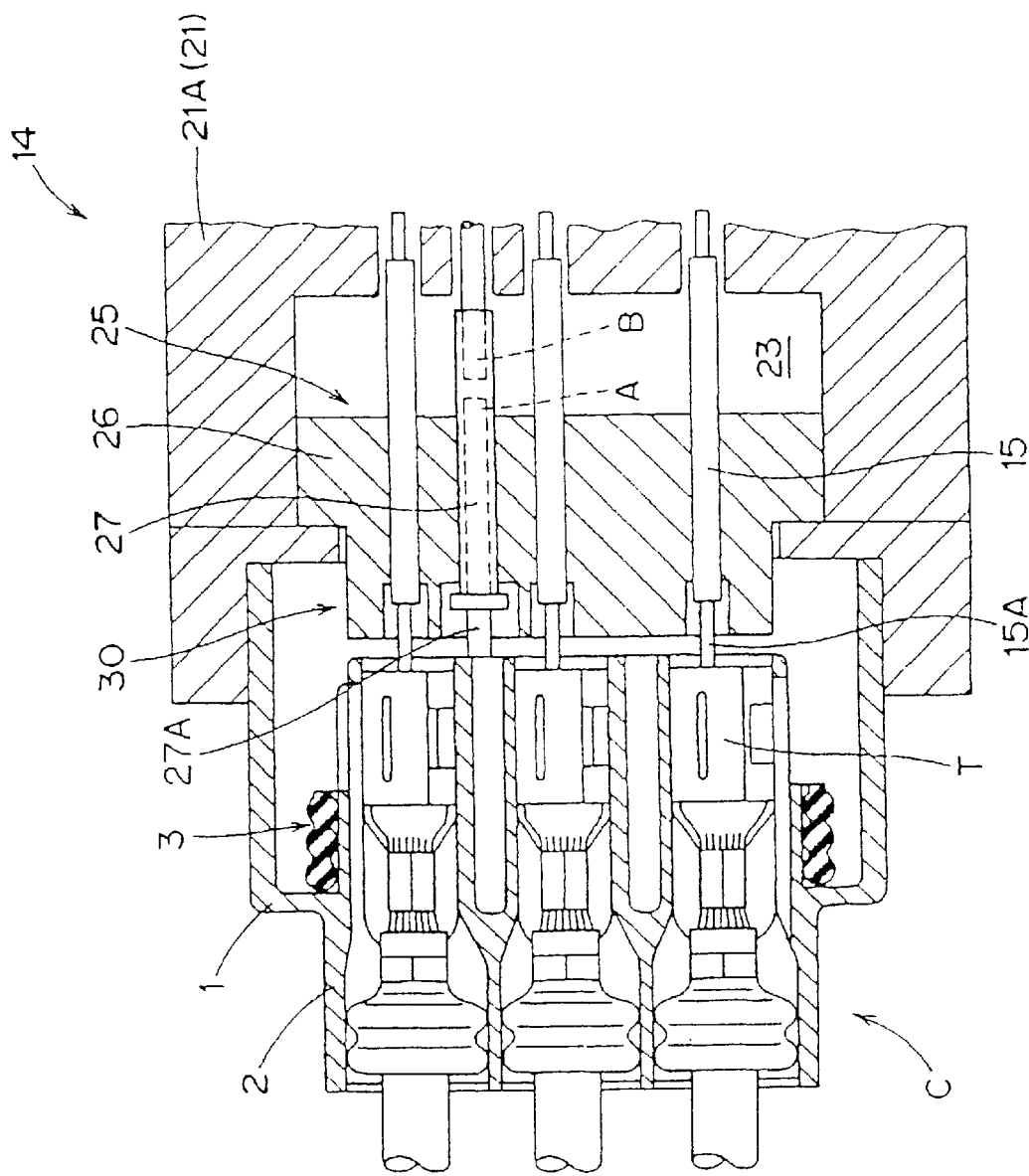
FIG. 3 illustrates a partly sectional enlarged view showing the finction of an inspection unit in the embodiment in FIG. 1.
Figure 4:
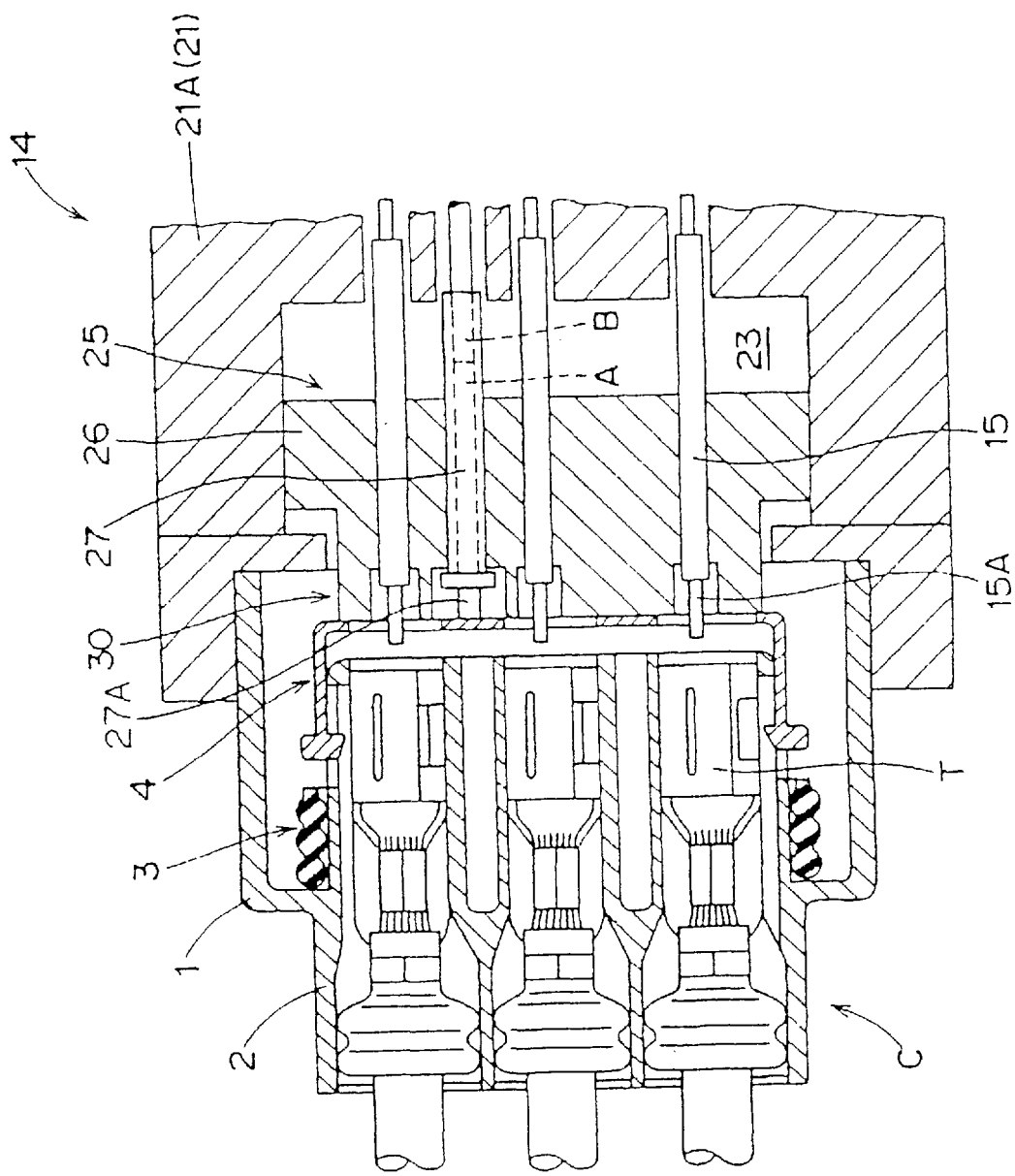
FIG. 4 illustrates a partly sectional enlarged view showing the function of an inspection unit in the embodiment in FIG. 1.
Figure 5:
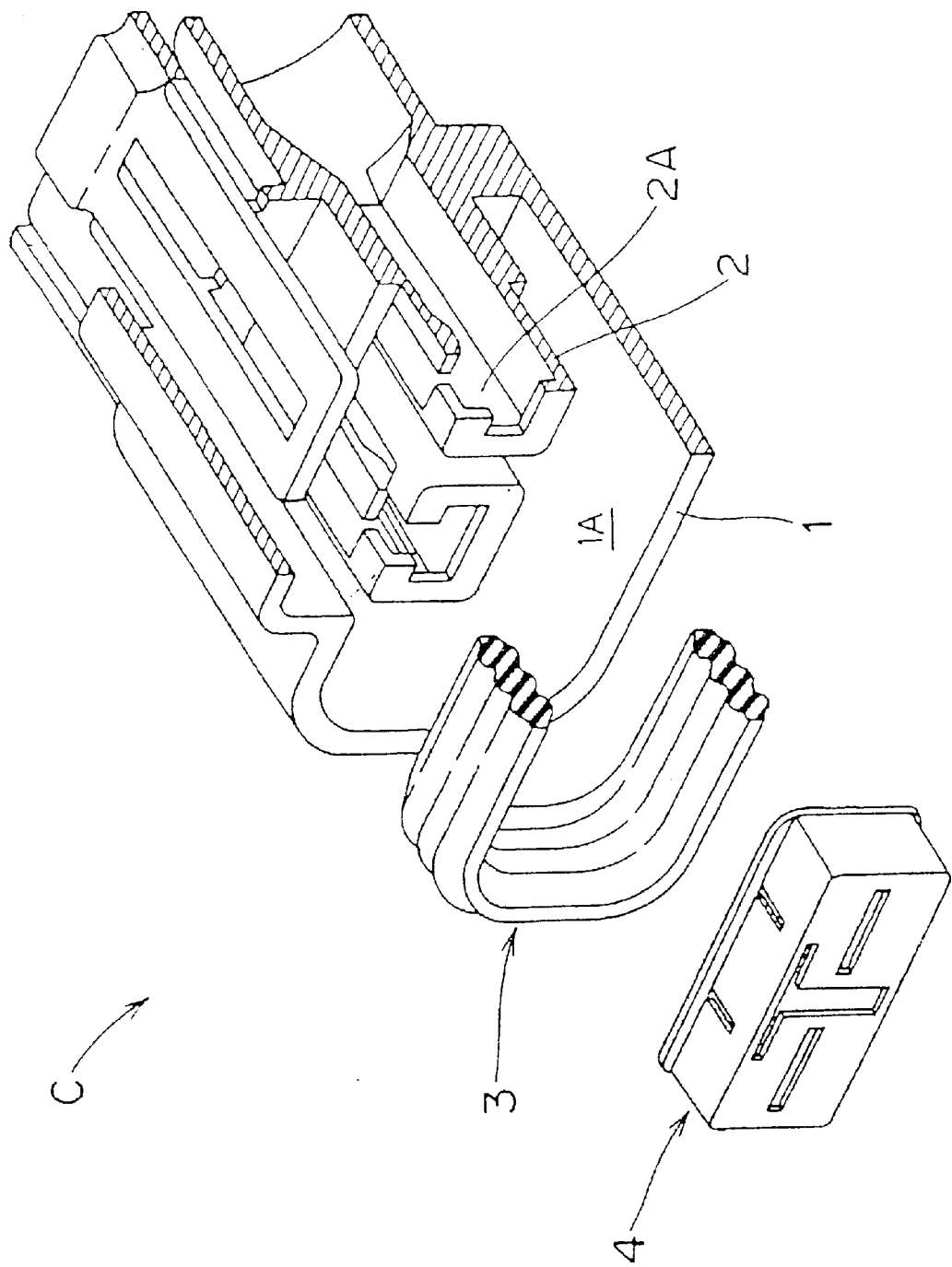
FIG. 5 illustrates a partially broken-away perspective view of a known connector of front holder type which is an object of testing according to the present invention.
Figure 6:
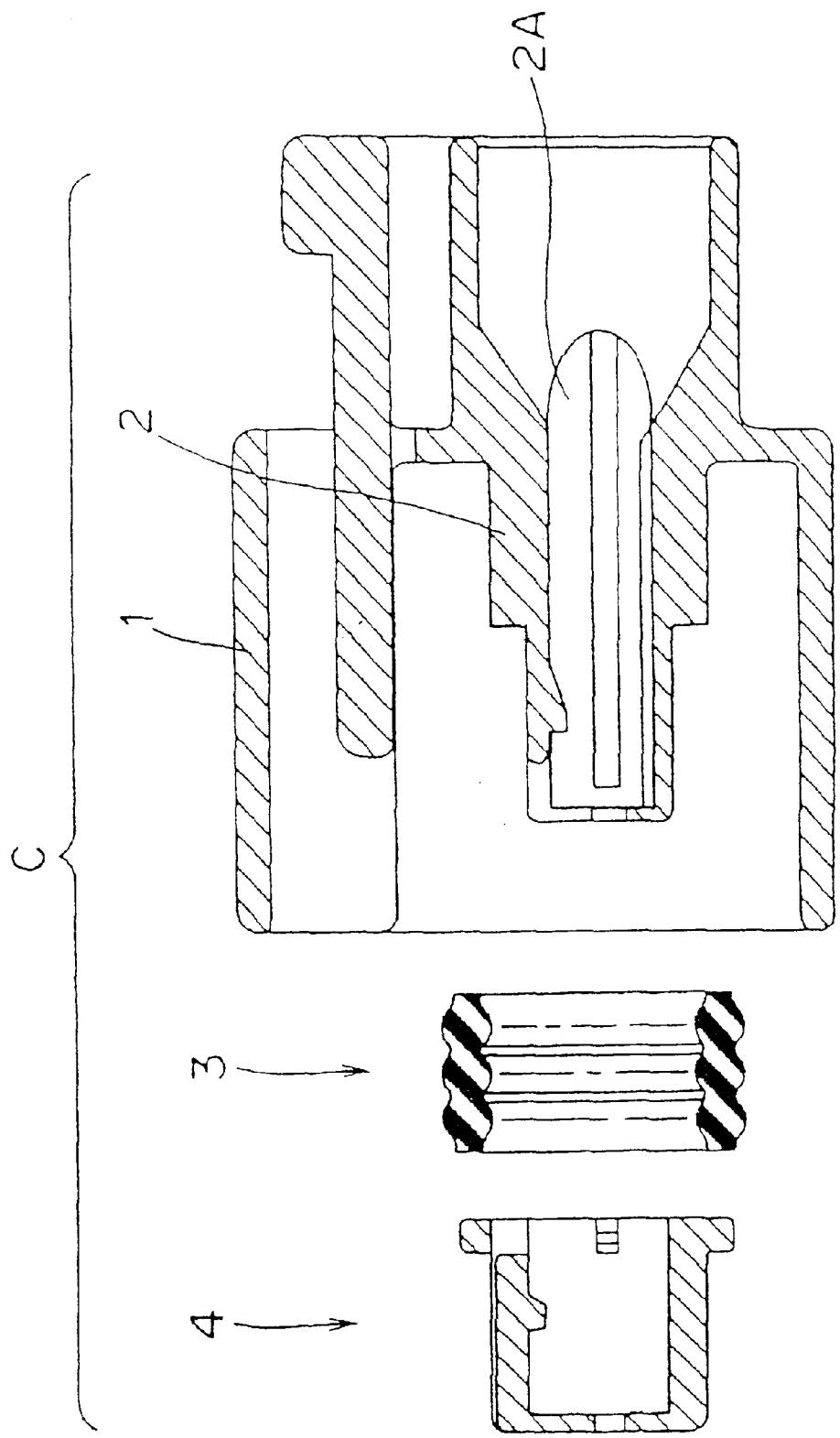
FIG. 6 illustrates an exploded sectional schematic view of the known connector in FIG. 5.

FIG. 1 shows a perspective view of a connector inspection apparatus A utilizing an inspection unit 14 according to one embodiment of the present invention. FIG. 2 shows a sectional view of the inspection unit 14 in the embodiment in FIG. 1, and FIGS. 3 and 4 show enlarged sectional views illustrating the function of the inspection unit 14 in the embodiment in FIG. 1. In this case, because the same kind of connector is utilized as the known connector depicted in FIGS. 5 and 6 in the description above, the same reference numerals are applied as to the known connector, and therefore further description is unnecessary.

First, with reference to FIG. 1, a continuity inspection apparatus of the present embodiment includes a pair of rails 12 integrally formed in parallel in a longitudinal direction on a substantially rectangular resin base 11. A connector receiving area 13, which holds and positions a housing 1 of connector C, is fixed on one end of the rails 12, and an inspection unit 14 is positioned on the other end and arranged for relative displacement toward and away from the connector receiving area 13. The inspection unit 14 is provided with probe pins 15 in correspondence with the number of terminals of the connector C which is an object of inspection, and the probe pins 15 are slidably and displaceably mounted on the above-mentioned rails 12 so that the probe pins 15 can displace between an inspection position (see FIG. 2) which makes contact with a respective metal terminal located within the connector housing C and an opened position (see FIG. 1) spaced from the connector housing C, the housing 1 being held within the connector receiving area 13. Furthermore, a toggle lever 16 is mounted on the end of the base 11 opposite the connector receiving area 13. The inspection unit 14 is displaced between the inspection position and the open position by oscillating the toggle lever 16 around the pin PV which passes through a mounting plate 17 extending from base 11, thereby making it possible to carry out a continuity inspection in a manner similar to that of conventionally known apparatus.

In the embodiment shown in the drawings, the inspection unit 14 has a block body 21 which extends vertically. The block body 21 is formed to have a substantially cubic shape from molded resin, and includes a main body area 21A, a front member 21B fixed on the front end surface of the main body area 21A, and a spring holder 21C molded on the rear end area of the main body area 21A. In the present case, with regard to the inspection unit 14, the connector receiving area 13 side is taken as a forward direction merely for expression in the following description.

With reference to FIG. 2, the main body area 21A of the block body 21 defines a rectangular housing area 23 which opens forwardly, and a pin unit 25 is slidably mounted therein for for-and-aft movement. The front member 21B is configured as a substantially rectangular frame member having an opening area narrower in extent than that of housing area 23. Front member 21B prevents removal of the pin unit 25 from the housing area 23. As is apparent from the drawings, the pin unit 25 is removable by detachably mounting the front member 21B on the main body area 21 by a plurality of small screws 18 (FIG. 1).

The pin unit 25 includes a slider 26 having a substantially rectangular shape and which is displaceable in the front and rear directions within the housing area 23. The probe pins 15 are integrally held by the slider 26, as is an inspection element 27 for inspecting the front holder 4 of the connector C. The slider 26 is slidably mounted for movement in the front and rear directions in the housing area 23 which is provided in the block main body area 21A.

The probe pins 15 are fixed to the slider 26 such that the pins 15 project from the front and rear thereof, as shown in FIG. 2. When the block body 21 is displaced to an inspection position with the connector C under conditions in which the slider 26 moves to the front end of the housing area 23, by making the pin area 15A of the tip of each probe pin 15 contact with a respective metal terminal T of connector C, continuity inspection can be carried out.

The rear end of each of the probe pins 15 is connected with a continuity inspection apparatus (which is not illustrated here) via a connecting pin 28 fixed to spring holder 21C which is mounted on the rear end area of the main body area 21A in the block body 21. The connecting pin 28 is, like the inspection element 27, a pin assembly including a coil spring 28A in the embodiment as illustrated in the drawing. A connecting pin 28 is provided for every probe pin 15, and is electrically connected with the probe pin 15. The probe pins 15 bias the slider 26 in the forward direction toward the connector C.

The inspection element 27 is a pin assembly having a spring switching function, conventionally called 2 probe pins, and makes contact with the front holder 4 prior to the pin area 15A of the probe pin 15 making contact with a metal terminal T. Thus, the front holder 4 can be inspected by contact points A and B of inspection element 27 making contact with each other. The biasing force of the spring (which is not illustrated here) for the inspection element 27 is set to be smaller than the biasing force of the above-mentioned connecting pin 28. According to the present invention, the spring holder 21C is formed with an insertion hole 21D so as to avoid the interference with the inspection element 27.

A step 30, which projects forwardly, is integrally formed in the front end area of the slider 26. The step 30 forms a contact area in the embodiment as shown in the FIG. 4, and, as described later, when the front holder 4 is in a mounting failure, step 30 permits the inspection element 27 to engage the front holder 4 during the course of a relative movement toward the inspection position of the block body 21 and connector C. Step 30 then controls the displacement of the slider 26 to avoid connection of probe pins 15 with the metal terminals T by making direct contact with front holder 4. The tip of pin 27A of the inspection element 27, when contacting a properly mounted front holder 4, is provided to become flush with the front end surface of the step 30. However, when the front holder 4 is not mounted in the normal position, i.e. so-called semi-interfit case, the step 30 makes direct contact with the front holder 4 after connection of the inspection element 27.

The description of the finction of the embodiment as mentioned above follows, with reference to FIG. 2 and FIG. 3.

In reference to FIG. 2, when moving the block body 21 to an inspection position, when a connector C to be an inspection object is properly configured, because the slider 26 is displaced forwardly by a biasing force of the connecting pins 28, initially, the inspection element 27 is connected by making contact with the front holder 4 and each probe pin 15 is electrically connected by making contact with the corresponding metal terminal T. Therefore, both the metal terminal T and the front holder 4 can be proved to be in a normal condition with this inspection.

Then, with reference to FIG. 3, when an inspection is made for a connector which is not mounted with a front holder 4, the respective probe pins 15 are connected while the inspection element 27 is not connected, which makes it possible to determine that the front holder 4 is missing.

In addition, with reference to FIG. 4, when the front holder 4 is partially installed, prior to reaching a normal inspection position by the block body 21 after the inspection element 27 makes contact with the front holder 4, the outer face of step 30 of slider 26 makes contact with the front holder 4 and controls the forward displacement of the slider 26. As a consequence, the slider 26 relatively displaces with the block body 21 against a biasing force, and only the block body 21 remains at the predetermined position and moves to the inspection position.

As a result, each probe pin 15 which is integral with the slider 26 also does not come into contact with the metal terminal T, and all of the probe pin 15 become disconnected. When this consequence comes about, a partially installed front holder 4 can be fully detected by visually observing the partial mounting of the front holder 4.

In this manner, with the above-mentioned embodiment, in the event of normal continuity inspection, inspection for the presence of front holder 4 and mounting failure of the front holder can be determined. It is possible to detect the mounting failure of the front holder 4 due to the fact that all the probe pins 15 remain disconnected with the metal terminals T while the inspection element 27 is connected, as seen in FIG. 4. At this point, since the slider 26 is at a condition being elastically controlled as to the displacement against the biasing force of connecting pins 28 as a biasing mechanism, it becomes possible to lessen the effects of a collision between the front holder 4 and the face of step 30 for protecting both against damage.

Therefore, according to the above-mentioned embodiment, in carrying out an inspection of a connector C of the front holder type, the remarkable results are exhibited of not only confirming the presence of the front holder 4 but also detecting the mounting failure of the front holder 4, thereby avoiding the non-conformity caused by mounting failure of the front holder 4.

Each embodiment mentioned above is only a preferred concrete example of the present invention, and does not restrict the scope of the above-described embodiments of the present invention. Needless to say, various design alterations can be made possible within a scope of the claims of the present invention.

As mentioned above, according to the present invention, in case of normal continuity inspection, inspection for the existence of front holder and a determination of a mounting failure of the front holder are made. It becomes possible to detect the mounting failure of the front holder due to the fact that all the probe pins are disconnected with the metal terminals under the condition of the inspection element being connected. At this point, since displacement of the slider is being elastically controlled by the biasing force of the connecting pins as a biasing mechanism, it is possible to lessen the effects of a collision between the front holder and the face of the step, thereby protecting both against damage.

Therefore, according to the present invention, in carrying out inspection of a connector of the front holder type, the remarkable results are achieved of not only confirming the presence of the front holder but also detecting the mounting failure of front holder, thereby avoiding the nonconformity caused by mounting failure of the front holder.

The present disclosure relates to subject matter contained in priority Japanese Application No. HEI 9-206815 filed on Jul. 31, 1997, which is herein expressly incorporated by reference in its entirety.

What is claimed:

1. An inspection unit of a connector inspection apparatus in combination with a connector, said connector comprising:
    a hollow housing;

a boss member integrally formed inside a periphery of said housing, said boss member including sectioned cavities for insertion of terminals, one end of said boss member opening inside an opening on one side of said housing while the other end of said boss member projects from an opening on the other side of the housing; and, a box-type front holder which covers one side terminal area of said boss member;

wherein said inspection unit is mounted on the connector inspection apparatus for inspection of a front holder type connector on which a plurality of terminal-fitted wires is mounted by inserting a metal terminal of a terminal-fitted wire from the other side of said boss member, and said inspection unit is relatively displaceable to an inspecting position for inspecting said connector by accessing said connector and to a release position which detachably releases said connector from the connector inspection apparatus by moving away from the inspection position;

said inspection unit further comprising;

a block body relatively displaceable between an inspection position and a released position for a connector held by the connector inspection apparatus, and a slider relatively and displaceably mounted on the block body for displacement relative to said block body in a direction toward and away from connector;

at least one probe pin mounted on said slider for inspecting the continuity of metal terminals of the connector, a biasing mechanism mounted between said block body and said slider for biasing said slider toward said connector, an inspection element having a switching function to be connected by a biasing force weaker than the biasing mechanism projecting toward a connector side being mounted on said slider and connected with said front holder of said connector during inspection, and a contact area which controls the displacement of said slider so as to interrupt the connection with the metal terminal of said at least one probe pin, by making contact with said front holder after connecting said inspection element during relative access of said block body and said connector to the inspection position in the event said slider being integrally formed and said front holder being subject to a mounting failure.

2. An inspection unit for a connector inspection apparatus, comprising:

a block body relatively displaceable between an inspection position for a connector held by said inspection unit and a position spaced therefrom;

a slider mounted on said block body for movement relative to said block body in a direction toward and away from the connector;

at least one probe pin mounted on said slider for inspecting the continuity of metal terminals of the connector; and an inspection element mounted on said slider for detecting the presence of a front holder for terminals of the connector.

3. The inspection unit for a connector inspection apparatus according to claim 2, wherein said inspection element comprises a spring biased switching element which projects outwardly from said slider and is biased toward the inspection position of the connector.

4. The inspection unit for a connector inspection apparatus according to claim 2, including a biasing mechanism for biasing said slider toward the connector to be inspected.

5. The inspection unit for a connector inspection apparatus according to claim 4, wherein said biasing mechanism includes a spring corresponding with each said probe pin for thereby biasing said slider toward the connector to be inspected.

6. The inspection unit for a connector inspection apparatus according to claim 5, wherein said inspection element comprises a spring biased switching element which projects outwardly from said slider and is biased toward the inspection position of the connector.

7. The inspection unit for a connector inspection apparatus according to claim 6, wherein the biasing force applied to said inspection element is less than that applied to a respective probe pin.

8. The inspection unit for a connector inspection apparatus according to claim 2, wherein said slider is removably mounted within said block body.

9. The inspection unit for a connector inspection apparatus according to claim 8, a front member is removably mounted on the block body to provide the removability of the slider.

* * * * *

UNITED STATES PATENT AND TRADEMARK OFFICE
CERTIFICATE OF CORRECTION

PATENT NO.    : 6,316,951 B1
DATED         : November 13, 2001
INVENTOR(S)   : K. Chiyoda It is certified that error appears in the above-identified patent and that said Letters Patent is hereby corrected as shown below:

<u>Title page,</u>
Item [56], References Cited, FOREIGN PATENT DOCUMENTS, the following should be deleted:  "0123456     1/2000         (EP)"

Signed and Sealed this

Eighteenth Day of June, 2002

*Attest:*

*Attesting Officer*

JAMES E. ROGAN
*Director of the United States Patent and Trademark Office*